(12) United States Patent
Haitsma et al.

(10) Patent No.: US 7,921,296 B2
(45) Date of Patent: Apr. 5, 2011

(54) GENERATING AND MATCHING HASHES OF MULTIMEDIA CONTENT

(75) Inventors: Jaap Andre Haitsma, Eindhoven (NL); Antonius Adrianus Cornelis Maria Kalker, Eindhoven (NL); Constant Paul Marie Jozef Baggen, Eindhoven (NL); Job Cornelis Oostveen, Eindhoven (NL)

(73) Assignee: Gracenote, Inc., Emeryville, CA (US)

( * ) Notice: Subject to any disclaimer, the term of this patent is extended or adjusted under 35 U.S.C. 154(b) by 920 days.

(21) Appl. No.: 11/800,904

(22) Filed: May 7, 2007

(65) Prior Publication Data
US 2008/0263360 A1    Oct. 23, 2008

Related U.S. Application Data

(63) Continuation of application No. 10/073,772, filed on Feb. 11, 2002, now Pat. No. 7,549,052.

(30) Foreign Application Priority Data

Feb. 12, 2001  (EP) ..................................... 01200505
Jul. 17, 2001  (EP) ..................................... 01202720

(51) Int. Cl.
*H04L 9/00*      (2006.01)
(52) U.S. Cl. ............ 713/180; 713/168; 713/186; 380/54
(58) Field of Classification Search .................... 713/180
See application file for complete search history.

(56) References Cited

U.S. PATENT DOCUMENTS

| | | | |
|---|---|---|---|
| 4,030,119 A | 6/1977 | Ellis | |
| 4,677,466 A | 6/1987 | Lert, Jr. et al. | |
| 4,857,899 A | 8/1989 | Ishii | |
| 4,992,706 A | 2/1991 | Troemel et al. | |
| 5,019,899 A * | 5/1991 | Boles et al. ...................... | 725/22 |
| 5,113,383 A | 5/1992 | Amemiya et al. | |
| 5,132,949 A | 7/1992 | Choi | |

(Continued)

FOREIGN PATENT DOCUMENTS
DE       4309957        7/1994

(Continued)

OTHER PUBLICATIONS

"U.S. Appl. No. 09/933,845, Response filed Feb. 8, 2010 to Non Final Office Action mailed Oct. 6, 2009", 14 pgs.

(Continued)

*Primary Examiner* — Kimyen Vu
*Assistant Examiner* — Yogesh Paliwal
(74) *Attorney, Agent, or Firm* — Schwegman Lundberg & Woessner, P.A.

(57) ABSTRACT

Hashes are short summaries or signatures of data files which can be used to identify the file. The disclosed method generates robust hashes for multimedia content, for example, audio clips. The audio clip is divided into successive (preferably overlapping) frames. For each frame, the frequency spectrum is divided into bands. A robust property of each band (e.g. energy) is computed and represented by a respective hash bit. An audio clip is thus represented by a concatenation of binary hash words, one for each frame. To identify a possibly compressed audio signal, a block of hash words derived therefrom is matched by a computer with a large database. Such matching strategies are also disclosed. In an advantageous embodiment, the extraction process also provides information as to which of the hash bits are the least reliable. Flipping these bits considerably improves the speed and performance of the matching process.

9 Claims, 6 Drawing Sheets

U.S. PATENT DOCUMENTS

| | | | |
|---|---|---|---|
| 5,157,614 A | 10/1992 | Kashiwazaki et al. | |
| 5,157,646 A | 10/1992 | Amemiya et al. | |
| 5,220,567 A * | 6/1993 | Dooley et al. | 714/704 |
| 5,229,768 A | 7/1993 | Thomas | |
| 5,263,010 A | 11/1993 | Amemiya et al. | |
| 5,276,629 A | 1/1994 | Reynolds | |
| 5,341,350 A | 8/1994 | Frank et al. | |
| 5,400,261 A | 3/1995 | Reynolds | |
| 5,436,653 A | 7/1995 | Ellis et al. | |
| 5,499,294 A | 3/1996 | Friedman | |
| 5,519,435 A | 5/1996 | Anderson | |
| 5,612,729 A | 3/1997 | Ellis et al. | |
| 5,616,876 A | 4/1997 | Cluts | |
| 5,621,454 A | 4/1997 | Ellis et al. | |
| 5,703,795 A | 12/1997 | Mankovitz | |
| 5,721,827 A | 2/1998 | Logan et al. | |
| 5,751,672 A | 5/1998 | Yankowski | |
| 5,767,893 A | 6/1998 | Chen et al. | |
| 5,774,664 A | 6/1998 | Hidary et al. | |
| 5,774,666 A | 6/1998 | Portuesi | |
| 5,778,181 A | 7/1998 | Hidary et al. | |
| 5,778,187 A | 7/1998 | Monteiro et al. | |
| 5,782,692 A | 7/1998 | Stelovsky | |
| 5,790,793 A | 8/1998 | Higley | |
| 5,796,393 A | 8/1998 | MacNaughton et al. | |
| 5,796,952 A | 8/1998 | Davis et al. | |
| 5,809,250 A | 9/1998 | Kisor | |
| 5,809,512 A | 9/1998 | Kato | |
| 5,822,436 A | 10/1998 | Rhoads | |
| 5,862,223 A | 1/1999 | Walker et al. | |
| 5,893,910 A | 4/1999 | Martineau et al. | |
| 5,907,793 A | 5/1999 | Reams | |
| 5,915,288 A | 6/1999 | Gabriel | |
| 5,918,223 A | 6/1999 | Blum et al. | |
| 5,925,843 A | 7/1999 | Miller et al. | |
| 5,953,005 A | 9/1999 | Liu | |
| 5,960,081 A | 9/1999 | Vynne et al. | |
| 5,960,411 A | 9/1999 | Hartman et al. | |
| 5,987,525 A | 11/1999 | Roberts et al. | |
| 5,999,637 A | 12/1999 | Toyoda et al. | |
| 6,034,925 A | 3/2000 | Wehmeyer | |
| 6,061,680 A | 5/2000 | Scherf et al. | |
| 6,067,126 A | 5/2000 | Alexander | |
| 6,076,104 A | 6/2000 | McCue | |
| 6,076,111 A | 6/2000 | Chiu et al. | |
| 6,078,301 A | 6/2000 | Arai et al. | |
| 6,098,106 A | 8/2000 | Philyaw et al. | |
| 6,101,482 A | 8/2000 | DiAngelo et al. | |
| 6,154,773 A | 11/2000 | Roberts et al. | |
| 6,195,693 B1 | 2/2001 | Berry et al. | |
| 6,201,176 B1 | 3/2001 | Yourlo | |
| 6,240,459 B1 | 5/2001 | Roberts et al. | |
| 6,247,022 B1 | 6/2001 | Yankowski | |
| 6,260,059 B1 | 7/2001 | Ueno et al. | |
| 6,266,429 B1 | 7/2001 | Lord et al. | |
| 6,272,078 B2 | 8/2001 | Yankowski | |
| 6,304,523 B1 | 10/2001 | Jones et al. | |
| 6,345,256 B1 | 2/2002 | Milsted et al. | |
| 6,388,957 B2 | 5/2002 | Yankowski | |
| 6,388,958 B1 | 5/2002 | Yankowski | |
| 6,408,082 B1 | 6/2002 | Rhoads et al. | |
| 6,411,725 B1 | 6/2002 | Rhoads | |
| 6,484,156 B1 | 11/2002 | Gupta et al. | |
| 6,505,160 B1 | 1/2003 | Levy et al. | |
| 6,601,046 B1 | 7/2003 | Epstein | |
| 6,633,653 B1 | 10/2003 | Hobson et al. | |
| 6,647,128 B1 | 11/2003 | Rhoads | |
| 6,654,735 B1 | 11/2003 | Eichstaedt et al. | |
| 6,665,417 B1 | 12/2003 | Yoshiura et al. | |
| 6,674,876 B1 | 1/2004 | Hannigan et al. | |
| 6,700,990 B1 | 3/2004 | Rhoads | |
| 6,737,957 B1 | 5/2004 | Petrovic et al. | |
| 6,748,533 B1 | 6/2004 | Wu et al. | |
| 6,782,116 B1 | 8/2004 | Zhao et al. | |
| 6,829,368 B2 | 12/2004 | Meyer et al. | |
| 6,941,003 B2 | 9/2005 | Ziesig | |
| 6,941,275 B1 | 9/2005 | Swierczek | |
| 6,952,774 B1 | 10/2005 | Kirovski et al. | |
| 6,963,975 B1 | 11/2005 | Weare | |
| 6,970,886 B1 | 11/2005 | Conwell et al. | |
| 6,983,289 B2 | 1/2006 | Commons et al. | |
| 6,990,453 B2 | 1/2006 | Wang et al. | |
| 6,996,775 B1 | 2/2006 | Dey et al. | |
| 7,024,018 B2 | 4/2006 | Petrovic | |
| 7,080,253 B2 | 7/2006 | Weare | |
| 7,082,394 B2 | 7/2006 | Burges et al. | |
| 7,152,021 B2 | 12/2006 | Alattar et al. | |
| 7,159,117 B2 | 1/2007 | Tanaka | |
| 7,188,248 B2 | 3/2007 | Watson | |
| 7,302,574 B2 | 11/2007 | Conwell et al. | |
| 7,349,552 B2 | 3/2008 | Levy et al. | |
| 7,349,555 B2 | 3/2008 | Rhoads | |
| 7,415,129 B2 | 8/2008 | Rhoads | |
| 7,461,136 B2 | 12/2008 | Rhoads | |
| 7,477,739 B2 | 1/2009 | Haitsma et al. | |
| 7,549,052 B2 | 6/2009 | Haitsma et al. | |
| 7,587,602 B2 | 9/2009 | Rhoads | |
| 7,590,259 B2 | 9/2009 | Levy et al. | |
| 2001/0004338 A1 | 6/2001 | Yankowski | |
| 2001/0014868 A1 | 8/2001 | Herz et al. | |
| 2001/0031066 A1 | 10/2001 | Meyer et al. | |
| 2002/0023020 A1 | 2/2002 | Kenyon et al. | |
| 2002/0033844 A1 | 3/2002 | Levy et al. | |
| 2002/0059208 A1 | 5/2002 | Abe et al. | |
| 2002/0078359 A1 | 6/2002 | Seok et al. | |
| 2002/0116195 A1 | 8/2002 | Pitman et al. | |
| 2002/0120849 A1 | 8/2002 | McKinley et al. | |
| 2002/0178410 A1 | 11/2002 | Haitsma et al. | |
| 2003/0023852 A1 | 1/2003 | Wold | |
| 2003/0028796 A1 | 2/2003 | Roberts et al. | |
| 2003/0033321 A1 | 2/2003 | Schrempp et al. | |
| 2003/0037010 A1 | 2/2003 | Schmelzer | |
| 2003/0086341 A1 | 5/2003 | Wells et al. | |
| 2003/0097338 A1 | 5/2003 | Mankovich et al. | |
| 2004/0028281 A1 | 2/2004 | Cheng et al. | |
| 2004/0128512 A1 | 7/2004 | Sharma et al. | |
| 2004/0172411 A1 | 9/2004 | Herre et al. | |
| 2004/0260682 A1 | 12/2004 | Herley et al. | |
| 2005/0004941 A1 | 1/2005 | Kalker et al. | |
| 2006/0041753 A1 | 2/2006 | Haitsma | |
| 2006/0075237 A1 | 4/2006 | Seo et al. | |
| 2006/0143190 A1 | 6/2006 | Haitsma et al. | |
| 2006/0206563 A1 | 9/2006 | Van De Sluis | |
| 2006/0218126 A1 | 9/2006 | De Ruijter et al. | |
| 2007/0071330 A1 | 3/2007 | Oostveen et al. | |
| 2007/0106405 A1 | 5/2007 | Cook et al. | |

FOREIGN PATENT DOCUMENTS

| | | |
|---|---|---|
| DE | 44 27 046 C2 | 2/2001 |
| EP | 194143 | 9/1986 |
| EP | 0283570 A3 | 9/1988 |
| EP | 0367585 A2 | 5/1990 |
| EP | 0367585 A3 | 5/1990 |
| EP | 460869 | 12/1991 |
| EP | 0319567 B1 | 2/1993 |
| EP | 0936531 A2 | 8/1999 |
| EP | 0991213 A2 | 4/2000 |
| EP | 1197020 B1 | 11/2007 |
| GB | 2338869 A1 | 12/1999 |
| JP | 63-104099 | 5/1988 |
| JP | 04299399 | 10/1992 |
| JP | 40299399 | 10/1992 |
| JP | 06-225799 | 8/1994 |
| JP | 06315298 | 11/1994 |
| JP | 11-261961 | 9/1999 |
| JP | 2000115093 | 4/2000 |
| JP | 2000-285237 | 10/2000 |
| JP | 2000-305578 | 11/2000 |
| JP | 2001283568 A2 | 10/2001 |
| WO | WO-9705616 A1 | 2/1997 |
| WO | WO-9721291 | 6/1997 |
| WO | WO-98006195 A1 | 2/1998 |
| WO | WO-98021679 A1 | 5/1998 |
| WO | WO-9825269 | 6/1998 |
| WO | WO-9935771 | 7/1999 |
| WO | WO-00017793 A1 | 3/2000 |
| WO | WO-00019648 A3 | 4/2000 |

| WO | WO-00031906 A1 | 6/2000 |
| WO | WO-00043904 A1 | 7/2000 |
| WO | WO-0128222 | 4/2001 |
| WO | WO-0211123 A3 | 2/2002 |
| WO | WO-02065782 | 8/2002 |
| WO | WO-02065782 A1 | 8/2002 |
| WO | WO-03012695 A2 | 2/2003 |
| WO | WO-2004077430 | 2/2004 |
| WO | WO-2006044622 | 4/2006 |
| WO | WO-2007022533 A2 | 2/2007 |

OTHER PUBLICATIONS

"U.S. Appl. No. 10/534,323, Response filed Dec. 18, 2009 to Non Final Office Action mailed Sep. 21, 2009", 12 pgs.

"European Application Serial No. 09172380.9, European Search Report Mailed Nov. 23, 2009", 8 pgs.

Hearst, M., et al., "The Exploratory Workshop on Music Information Retrieval", *International Conference on Research and Development in Information Retrieval*, Berkeley, CA, (Aug. 19, 1999), 1-14.

"U.S. Appl. No. 10/534,323, Non-Final Office Action mailed Mar. 18, 2010", 7.

*Information Retrieval (Z39.50): Application Service Definition and Protocol Specification*, ANSI/NISO Z39.50 1995, (Jul. 1995), 163 pgs.

Proposal No. 95-1—*Changes to Field 856 (Electronic Location and Access) in the USMARC Bibliographic Format*, http://www.loc.gov/marc/marbi/1995/95-01.html, SOURCE: Library of Congress; Federal Geographic Data Committee,(Dec. 2, 1994), 13 sheets.

Proposal No. 95-8—*Define Field 856 (Electronic Location and Access) in the USMARC Classification Format*, http://www.loc.gov/marc/marbi/1995/95-08.html, Source: Library of Congress,(May 5, 1995), 1-2.

*PURL Frequently Asked Questions*, http://purl.oclc.org/docs/purl_faq.html,(Mar. 20, 1996), 19 sheets.

Proposal No. 96-1—*Changes to Field 856 (Electronic Location and Access) in the USMARC Formats*, http://www.loc.gov/marc/marbi/1996/96-01.html, Source: Library of Congress,(Dec. 1, 1995), 12 pgs.

*Bookwhere for Windows v.1.1—README*, Sea Change Corporation,(1995),2 pgs.

*GeoPac Management Guide*, Release 1.25, Geac Computer Corporation Limited,(Dec. 1994),50 pgs.

*Internet Protocol: Darpa Internet Program Protocol Specification*, Prepared for Defense Advanced Research Projeccts Agency by Information Sciences Institute,(Sep. 1981),1-45.

*BookWhere for Windows*, Help Topics for BookWhere,(No date listed),16 pgs.

*BookWhere for Windows v. 2.1—README*, Sea Change Corporation,(1996),7 pgs.

*BookWhere for Windows User Guide*, Software Version 2.0—Manual Version 2.0.4, Sea Change Corporation,(Sep. 11, 1996),1-36.

*Workman Changes*, Release 1.3, (1994).

*USMARC Format for Bibliographic Data, Including Guidelines for Content Designation*, Prepared by Network Development & MARC Standards Office, Cataloging Distribution Service, Library of Congress,(1994).

*USMARC Format for Bibliographic Data, Update #2*, Prepared by Network Development & MARC Standards Office, Cataloging Distribution Service, Library of Congress,(Mar. 1996).

*Online Systems: Sound Recordings Format*, OCLC Online Computer Library Center, Dublin Ohio,(1986),1-318.

*Philips Ambilight TV News Release*, http://www.techdigest.tv/2006/01/ces_2006_philip_3.html, CES, (2006).

*XKeysymDB 6.1*, (Feb. 20, 1995),7 pgs.

"CD Red Book Standard", *IEC 60908 Ed. 2.0*, Sony/Philips,(1999),1-209 pgs.

"CD-I has a tough road to hoe", http://www.caruso.com/Digital_Media/DM91-07.txt (No date listed),43 pgs.

"Chapter 69—Introduction to Multimedia Services", *Microsoft Win32 Programmer's Reference*, vol. 2, Redmond, Wash. : Microsoft Press,(1993),517-672.

"CNET: The Computer Network Unveils Revolutionary Internet Advertising Tools that Allow Custom Banner Ad Delivery Based on Demographic Information", http://www.cnet.com/html/aboutcnet/press/1994_95/120695.html, Press Releases,(Dec. 6, 1995),4 pgs.

"Generic coding of moving pictures and associated audio information, part 2", *ISO/IEC*, (1995).

"Information and documentation—International Standard Recording Code (ISRC)", *ISO 3901*, (2001),23 pgs.

"Information technology—Multimedia content description interface—Part 4: Audio.", *INCITS/ISO/IEC* 15938-4-2002, (2002),1-114.

"Multimedia databases and information systems", *Proceedings of the Second ACM International Conference on Multimedia*, (1994),67.

"Sirius Satellite Radio", http://www.sirius.com, (Accessed Apr. 18, 2006),1 pg.

"Specification of the radio data system (RDS)", *IEC standard 62106:2000*; http://webstore.iec.ch/preview/info_iec62106{ed1.0}en.pdf, (2000),6pgs.

"XM Radio", http://www.xm-radio.com/, (Accessed Apr. 18, 2006),1 pg.

Akscyn, Robert M., et al., "Design of hypermedia script languages: the KMS experience", *Proceedings of the Fifth ACM Conference on Hypertext*, (1993),268-269.

Allamanche, E, et al., "Content-Based Identification of Audio Material Using MPEG-7 Low Level Description", *Proceedings of the International Symposium of Music Information Retrieval*, (2001),8 pgs.

Baugher, Mark, et al., "A multimedia client to the IBM LAN server", *Proceedings of the first ACM International Conference on Multimedia*, (1993),105-112.

Beadle, H P., et al., "Location aware mobile computing", *Proceedings of the IEEE/IEE International Conference on Telecommunications*, (1997),1319-1324.

Berners-Lee, T., et al., *Hypertext Transfer Protocol—HTTP 1.0*, Network Working Group,(May 1996),61 pgs.

Broder, A. Z., et al., "Syntactic clustering of the Web", *Computer Networks and ISDN Systems*, 29(8-13), (Sep. 1997), 1157-1166.

Cano, P, et al., "A review of algorithms for audio fingerprinting", *Proceedings of 2002 IEEE Workshop on Multimedia Signal Processing*, Virgin Islands, USA, (2002),5 pgs.

Cano, Pedro, et al., "Robust Sound Modeling for Song Detection in Broadcast Audio", *Audio Engineering Society, 112th Convention*, Munich, Germany, (May 2002),1-7.

Chen, Qin-Sheng, et al., "Symmetric Phas-Only Matched Filtering of Fourier-Mellin Transforms for Image Registration and Recognition", *IEEE Transactions on Pattern Analysis and Machine Intelligence*, 16 No. 12, New York, (Dec. 1994),1156-1168.

Chua, T. S., et al., "Content-based retrieval of segmented images", *Proceedings of the Second ACM International Conference on Multimedia*, (1994),211-218.

Comer, Douglas E., et al., *Internetworking with TCP/IP*, vol. 2, *Design, implementation, and internals*, ANSI C Version, 3rd Edition, Upper Saddle River, NJ: Prentice Hall,(1999),1-660.

Comer, Douglas E., et al., *Internetworking with TCP/IP*, vol. 3, *Client-server programming and applications*, BSD Socket Version, Upper Saddle River, NJ: Prentice Hall,(1993),1-498.

Comer, Douglas, et al., "Chapter 4—Internet Addresses & Chapter 5—Mapping Internet Addresses to Physical Addresses (ARP)", *Internetworking with TCP/IP*, vol. 1, Upper Saddle River, N.J. : Prentice Hall,(1995),59-88, 588.

Courtiat, J. P., et al., "Towards a new multimedia synchronization mechanism and its formal definition", *Proceedings of the Second ACM International Conference on Multimedia*, (1994), 133-140.

Deep, John, et al., *Developing CGI applications with Perl*, New York : Wiley Computer Pub.,(1996),72-77.

Eddings, Joshua, *How the Internet Works*, Emeryville, Calif. : Ziff-Davis Press,(1994).

Fletcher, Peter A., et al., "Direct Embedding and Detection of RST Invariant Watermarks", *F.A.P. Petitcolas (Ed.): IH 2002, LNCS 2578 Springer-Verlag* Berlin Heidelberg, (2003),129-144.

Ghandeharizadeh, S., et al., "On multimedia repositories, personal computers, and hierarchical storage systems", *Proceedings of the Second ACM International Conference on Multimedia*, (1994),407-416.

Graham, Ian S., *The HTML Sourcebook*, John Wiley & Sons,(1995).

Haitsma, J., et al., "A Highly Robust Audio Fingerprinting System", *ISMIR 2002—3rd International Conference on Music Information Retrieval*, http://ismir2002.ismir.net/proceedings/02-fp04-2.pdf,(Oct. 17, 2002),1-9.

Haitsma, Jaap, "Robust Audio Hashing for Content Identification", *Philips Research*, 8 pages.

Haitsma, J. A., et al., "Robust Hashing of Multimedia Content", (Dec. 14, 2000), 10 pgs.

Hertzfeld, Andy, "User interface and artistic values", http://hci.stanford.edu/cs547/abstracts/91-92/920415-hertzfeld.html, Stanford University Program in Human-Computer Interaction,(Apr. 15, 1992).

Hirata, K., et al., "Media-based navigation for hypermedia systems", *Proceedings of the Fifth ACM Conference on Hypertext*, (1993),159-173.

Kan, Ti, *XMCD Version 2.0 patchlevel 0*, BSD News Article 64976,(Apr. 3, 1996).

Kan, Ti, *XMCD Unix CD Player*, (Mar. 21, 1996).

Kurth, Frank, et al., "Full-Text Indexing of Very Large Audio Data Bases", *Audio Engineering Society Convention Paper, 110th Convention*, Amsterdam, (May 2001),1-11.

Lenk, John D., *Lenk's laser handbook : featuring CD, CDV, and CD-ROM technology*, New York : McGraw-Hill,(1992),2.1-2.12.

Lewis, P. H., et al., "Content based navigation in multimedia information systems", *Proceedings of the Fourth ACM International Conference on Multimedia*, (1997),415-416.

Lewis, Paul H., et al., "Media-based Navigation with Generic Links", *Proceedings of the the Seventh ACM Conference on Hypertext*, (1996),215-223.

Li, L., et al., "MPEG-2 coded- and uncoded-stream synchronization control for real-time multimedia transmission and presentation over B-ISDN", *Proceedings of the Second ACM International Conference on Multimedia*, (1994),239-246.

Lienhart, R., "Automatic text recognition for video indexing", *Proceedings of the Fourth ACM International Conference on Multimedia*, (1997),11-20.

Lin, Ching-Yung, et al., "Rotation, Scale, and Translation Resilient Watermarking for Images", *IEEE Transactions on Image Processing*, vol. 10, No. 5, (May 2001),767-782.

Little, T. D., et al., "A digital on-demand video service supporting content-based queries", *Proceedings of the First ACM International Conference on Multimedia*, (1993),427-436.

Mascha, M., et al., "Interactive education: Transitioning CD-ROMs to the Web", *Computer Networks and ISDN Systems*, 27(2), (Nov. 1994),267-272.

Mayer-Patel, Ketan, et al., "Synchronized continuous media playback through the World Wide Web", *Proceedings of the Fourth ACM International Conference on Multimedia*, (1997),435-436.

Neuschmied, Helmut, et al., "Content-based Identification of Audio Titles on the Internet", *Proceedings of the First International Conference on WEB Delivering of Music*, (2001),5 pages.

Nilsson, M., "ID3 tag version 2.3.0", http://www.id3.org/id3v2.3.0.txt, (Feb. 3, 1999).

Oikarinen, J., et al., "Internet Relay Chat Protocol", *RFC 1459, Network Working Group*, (May 1993).

Oostveen, Job, et al., "Feature Extraction and a Database Strategy for Video Fingerprinting", *Visual 2002, LNCS 2214 Copyright Springer-Verlag* Berlin Heidelberg, (2002),117-128.

Oostveen, Job, "Visual Hashing of Digital Video: Applications and Techniques", 11 pages.

Pereira, Shelby, "Template Based Recovery of Fourier-Based Watermarks Using Log-Polar and Log-log Maps", *IEEE Int. Conf on Multimedia Computing and Systems*, Florence, Italy, (Jun. 1999),1-5.

Pfitzinger, H R., "The collection of spoken language resources in car environments", *ICLRE*, vol. 2, (1998),1097-1100.

Plenge, G., "DAB—A new radio broadcasting system—State of development and ways for its introduction", *Rundfunktechnische Mitteilungen*, 35(2), (1991),45-66.

Prabhakaran, B., et al., "Synchronization models for multimedia presentation with user participation", *Proceedings of the First ACM International Conference on Multimedia*, (1993),157-166.

Qazi, Naveed U., et al., "A synchronization and communication model for distributed multimedia objects", *Proceedings of the First ACM International Conference on Multimedia*, (1993),9 pgs.

Rajasekaran, P., et al., "Microcomputer Implementable Low Cost Speaker-Independent Word Recognition", *IEEE International Conference on ICASSP '83. Acoustics, Speech, and Signal Processing*, Abstract; p. 754, right-hand col., Appendix A, A.1, A.2; figure 1,(Apr. 14-16, 1983),753-756.

Rhoads, Geoffrey B., et al., "Managing on-line media library through links in media signals", U.S. Appl. No. 60/178,028.

Roscheisen, M., et al., "Beyond browsing: shared comments, SOAPs, trails, and on-line communities", *Computer Networks and ISDN Systems*, 27(6), (Apr. 1995),739-749.

Rowan, Clem W., et al., "When car radios were illegal: A history of early American and European car radios", *Society of Automotive Engineers Technical Paper Series*, (1985),1-20.

Scherf, Steve, *cddbd—CD Database Protocol Server*, Moondog Software Productions,(1996),48 sheets.

Schneider, Marc, et al., "A Robust Content Based Digital Signature for Image Authentication", *International Conference on Image Processing*, 1996. Proceedings., vol. 3, (1996),227-230.

Schneier, Bruce, "Chapter 16, Pseudo random sequence generators", *In Applied Cryptography*, John Wiley & Sons, New York, US, (1996),372-379.

Shafer, Keith, et al., "Introduction to Persistent Uniform Resource Locators", http://purl.oclc.org/docs/inet96.html, OCLC Online Computer Library Center, Inc.,(1996),8 pgs.

Shibata, Y., et al., "Dynamic hypertext and knowledge agent systems for multimedia information networks", *Proceedings of the Fifth ACM Conference on Hypertext*, (1993),82-93.

Smith, Brian C., et al., "The Berkeley continuous media toolkit", *Proceedings of the Fourth ACM International Conference on Multimedia*, (1997),451-452.

Subramanya, S R., et al., "Transform-Based Indexing of Audio Data for Multimedia Databases", *1997 IEEE*, (1997),211-218.

Thimbleby, H., et al., "Ethics and Consumer Electronics", *Proceedings of the 4th ETHICOMP International Conference on the Social and Ethical Impacts of Information and Communication Technologies*, (1999),9 pgs.

Tibbetts, Margery, Sep. 1995 *ZIG Meeting Minutes*, ftp://lcweb.loc.gov/pub/z3950/minutes/9509.txt,(Sep. 25, 1995),22 pgs.

Tompa, F. W., et al., "Hypertext by link-resolving components", *Proceedings of the Fifth ACM Conference on Hypertext*, (1993),118-130.

Troll, Denise, *Z39.50 Implementors Group Meeting Minutes*, ftp://lcweb.loc.gov/pub/z3950/minutes/9504.txt,(Apr. 25, 1995),29 pgs.

Weitzman, L., et al., "Automatic presentation of multimedia documents using relational grammars", *Proceedings of the Second ACM International Conference on Multimedia*, (1994),443-451.

Welsh, Matt, et al., "Querying Large Collections of Music for Similarity", Research sponsored by Advanced Research Projects Agency under grant DABT63-98-C-0038, and equipment grant from Intel Corp.,13 pages.

Yang, Cheng, "MACS: Music Audio Characteristic Sequence Indexing for Similarity Retrieval", Supported by Leonard J. Shustek Fellowship, Stanford Graduate Fellowship program, and NSF Grant IIS-9811904 New Paltz, New York, (Oct. 2001), 123-126.

Zhang, Hongjiang, et al., "Video Parsing, Retrieval and Browsing: An Integrated and Content-Based Solution", *ACM Multimedia 95—Electronic Proceedings*, San Francisco, California,(Nov. 5-9, 1995),19 pgs.

"U.S. Appl. No. 09/933,845, Response filed Oct. 22, 2007 to Final Office Action mailed Jul. 3, 2007", 13 pgs.

"U.S. Appl. No. 09/933,845, Non-Final Office Action mailed Feb. 29, 2008", 13 Pgs.

"U.S. Appl. No. 10/073,772, Notice of Allowance mailed May 23, 2008", 4 pgs.

"U.S. Appl. No. 10/073,772, Non-Final Office Action Mailed Jan. 9, 2008", 14 pgs.

"U.S. Appl. No. 10/503,245, Response filed Feb. 26, 2008 to Non-Final Office Action mailed Nov. 26, 2007", 13 pgs.
"U.S. Appl. No. 10/503,245, Final Office Action mailed on May 28, 2008", 23 pgs.
"U.S. Appl. No. 10/503,245, Non-Final Office Action mailed Nov. 26, 2007", 10 pgs.
"U.S. Appl. No. 10/529,360, Non-Final Office Action mailed Apr. 23, 2008", 10 pgs.
"U.S. Appl. No. 10/533,211, Response filed Mar. 5, 2008 to Final Office Action mailed Dec. 15, 2007", 6 pgs.
"U.S. Appl. No. 10/533,211, Response filed May 13, 2008 to Final Office Action mailed Dec. 5, 2007", 13 pgs.
"U.S. Appl. No. 10/533,211 Final Office Action mailed Dec. 5, 2007", 13 pgs.
"U.S. Appl. No. 10/534,323, Non-Final Office Action mailed Apr. 16, 2008", 7 pgs.
"U.S. Appl. No. 10/534,323, Response filed Jan. 3, 2008 to Non-Final Office Action mailed Oct. 3, 2007", 9 pgs.
"U.S. Appl. No. 10/534,323, Non-Final Office Action mailed Oct. 3, 2007", 8 Pages.
"International Application Serial No. 01976124.6, Office Action mailed Jan. 2, 2008", 7 pgs.
"International Application Serial No. 03798257.6, Office Action mailed Feb. 7, 2008", 6 pgs.
"International Application Serial No. 1976124.6, Office Action mailed Aug. 4, 2005", 4 pgs.
Haitshma, J., et al., ""Speed- Change Resistant Audio fingerprinting using Auto-correlation"", Philips Research Laboratories Eindhoven, *IEEE*, (2003), pp. 728-731.
Stephen, D., "The Exploratory Workshop on Music Information Retrieval", ACM SIGIR, (Aug. 19, 1999), 1-14.
"U.S. Appl. No. 09/933,845, Response filed Aug. 14, 2008 to Non Final Office Action mailed Feb. 29, 2008", 12 pgs.
"U.S. Appl. No. 10/073,772, Preliminary Amendment filed Jul. 28, 2008", 10 pgs.
"U.S. Appl. No. 10/503,245, Response filed Aug. 28, 2008 to Final Office Action mailed May 28, 2008", 13 pgs.
"U.S. Appl. No. 10/503,245, Notice of Allowance mailed Sep. 4, 2008", 16 pgs.
"U.S. Appl. No. 10/533,211 Non-Final Office Action mailed Jul. 29, 2008", 14 Pgs.
"U.S. Appl. No. 10/534,323, Response filed Jul. 16, 2008 to Non Final Office Action mailed Apr. 16, 2008", 9 pgs.
"Japanese Application Serial No. 2002-565363, Final Office Action mailed Jul. 14, 2008", 12 pgs.
"Korean Application Serial No. 10-2002-7005203, Office Action mailed May 28, 2008", 8 pgs.
"Korean Application Serial No. 10-2002-7013737, Final Office Action mailed Sep. 1, 2008", 5 pgs.
*The MusicBrainz Mailing List Archive for Nov. 2000*, 30 pgs.
"U.S. Appl. No. 09/933,845 Final Office Action mailed May 19, 2005", 10 pgs.
"U.S. Appl. No. 09/933,845 Final Office Action mailed Jul. 3, 2007", 15 pgs.
"U.S. Appl. No. 09/933,845 Final Office Action mailed Jul. 5, 2006", 14 pgs.
"U.S. Appl. No. 09/933,845 Non Final Office Action mailed Jan. 3, 2006", 9 pgs.
"U.S. Appl. No. 09/933,845 Non Final Office Action mailed Oct. 27, 2004", 7 pgs.
"U.S. Appl. No. 09/933,845 Non Final Office Action mailed Nov. 30, 2006", 15 pgs.
"U.S. Appl. No. 09/933,845 Response filed Jan. 27, 2005 to Non Final Office Action mailed Nov. 27, 2004", 8 pgs.
"U.S. Appl. No. 09/933,845 Response filed Mar. 28, 2006 to non-final office action mailed Jan. 3, 2006", 9 pgs.
"U.S. Appl. No. 09/933,845 Response filed Mar. 30, 2007 to Non Final Office Action mailed Nov. 30, 2006", 8 pgs.
"U.S. Appl. No. 10/073,772 Advisory Action mailed Jul. 28, 2006", 3 pgs.
"U.S. Appl. No. 10/073,772 Final Office Action mailed Apr. 6, 2006", 21 pgs.
"U.S. Appl. No. 10/073,772 Non Final Office Action mailed Sep. 19, 2005", 13 pgs.
"U.S. Appl. No. 10/073,772 Notice of Allowance mailed Feb. 28, 2007", 6 pgs.
"U.S. Appl. No. 10/073,772 Notice of Allowance mailed Aug. 9, 2007", NOAR,10 pgs.
"U.S. Appl. No. 10/073,772 Notice of Allowance mailed Sep. 6, 2006", 5 pgs.
"U.S. Appl. No. 10/073,772 Response filed Mar. 17, 2006 to Non Final Office Action mailed Sep. 19, 2005", 12 pgs.
"U.S. Appl. No. 10/073,772 Response filed Jul. 6, 2006 to Final Office Action mailed Apr. 6, 2006", 8 pgs.
"U.S. Appl. No. 10/073,772 Response filed Aug. 7, 2006 to Advisory Action mailed Jul. 28, 2006", 3 pgs.
"U.S. Appl. No. 10/533,211 Non Final Office Action mailed Nov. 14, 2006", 9 pgs.
"U.S. Appl. No. 10/533,211 Non Final Office Action mailed Jun. 12, 2007", 8 pgs.
"U.S. Appl. No. 10/533,211 Response filed Mar. 14, 2007 to non-final office action mailed Nov. 14, 2006", 8 pgs.
"U.S. Appl. No. 10/533,211, Response filed Oct. 1, 2007 to Non-Final Office Action mailed Jun. 12, 2007", 12 pgs.
"U.S. Appl. No. 10/548,702 Response filed Aug. 29, 2007 to Non-Final Office Action mailed Jun. 21, 2007", 64 pgs.
"U.S. Appl. No. 10/548,702 Non-Final Office Action mailed Jun. 21, 2007", 18 pgs.
"European Application Serial No. 01 976124 Office Action dated Mar. 16, 2007", 5 pgs.
"European Patent Application No. 03737399.0 Office Action", (Mar. 26, 2007),10 pgs.
"International Application No. PCT/EP01/09623 International Search Report mailed", (Jul. 2, 2002),4 pages.
Cheung, D. , et al., "A content-based search engine on medical images for telemedicine", *Proceedings of the 21st International Computer Software and Applications Conference*, (Aug. 13, 1997),569-572.
Martin, Keith D., et al., "Music Content Analysis through Models of Audition", (1998),8 pgs.
McNab, Rodger J., et al., "Towards the digital music library: tune retrieval from acoustic input", *Proceedings of the First ACM International Conference on Digital Libraries*, (1996),11-18.
Oostveen, J. , et al., "Feature Extraction and a Database Strategy for Video Fingerprinting", *Lecture Notes in Computer Science*, 2314, (Mar. 11, 2002),117-128.
Wells, Maxwell J., et al., "Music Search Methods Based on Human Perception", U.S. Appl. No. 09/556,086, filed Apr. 21, 2000, 50 pgs.
Wold, E. , "Content-based classification, search,. and retrieval of audio", *IEEE MultiMedia*, 3 (3), (Fall 1996),27-36.
"International Application Serial No. 2002-565363, Non-Final Office Action mailed Oct. 11, 2007", With English Translation,22 pgs.
"International Application Serial No. IN/PCT/2002/1689, First Examination Report Jun. 20, 2007", 2 pgs.
"U.S. Appl. No. 09/933,845, Final Office Action mailed May 12, 2009", 15 pgs.
"U.S. Appl. No. 09/933,845, Non Final Office Action Mailed Oct. 6, 2009", 17 pgs.
"U.S. Appl. No. 09/933,845, Non-Final Office Action mailed Nov. 25, 2008", 13 pgs.
"U.S. Appl. No. 09/933,845, Response filed Feb. 25, 2009 to Non-Final Office Action mailed Nov. 25, 2008", 11 pgs.
"U.S. Appl. No. 09/933,845, Response filed Oct. 5, 2006 to Final Office Action mailed Jul. 5, 2006", 10 pgs.
"U.S. Appl. No. 09/933,845, Response filed Sep. 14, 2009 to Final Office Action mailed May 12, 2009", 11 pgs.
"U.S. Appl. No. 09/976,038, Notice of Allowance and Fee(S) Due mailed Jun. 28, 2007", 4 pgs.
"U.S. Appl. No. 10/073,772, Notice of Allowance mailed Nov. 19, 2008", 7 pgs.
"U.S. Appl. No. 10/073,772, Supplemental Notice of Allowability mailed Nov. 2, 2006", 4 pgs.
"U.S. Appl. No. 10/529,360, Final Office Action mailed Apr. 17, 2009", 15 pgs.

"U.S. Appl. No. 10/529,360, Non-Final Office Action mailed Oct. 16, 2008", 14 pgs.

"U.S. Appl. No. 10/529,360, Response filed Feb. 16, 2009 to Non-Final Office Action mailed Oct. 16, 2008", 9 pgs.

"U.S. Appl. No. 10/529,360, Response filed Sep. 23, 2008 to Non-Final Office Action mailed Apr. 23, 2008", 9 pgs.

"U.S. Appl. No. 10/533,211, Advisory Action mailed Mar. 11, 2009", 3 pgs.

"U.S. Appl. No. 10/533,211, Advisory Action mailed Mar. 25, 2008", 3 pgs.

"U.S. Appl. No. 10/533,211, Final Office Action mailed Dec. 17, 2008", 16 pgs.

"U.S. Appl. No. 10/533,211, Response filed Feb. 16, 2009 to Final Office Action mailed Dec. 17, 2008", 11 pgs.

"U.S. Appl. No. 10/533,211, Response filed Oct. 29, 2008 to Non-Final Office Action mailed Jul. 29, 2008", 13 pgs.

"U.S. Appl. No. 10/534,323, Final Office Action mailed May 13, 2009", 12 pgs.

"U.S. Appl. No. 10/534,323, Non-Final Office Action mailed Sep. 21, 2009", 7 Pgs.

"U.S. Appl. No. 10/534,323, Non-Final Office Action mailed Oct. 31, 2008", 7 pgs.

"U.S. Appl. No. 10/534,323, Response filed Jan. 29, 2009 to Non-Final Office Action mailed Oct. 31, 2008", 9 pgs.

"U.S. Appl. No. 10/534,323, Response filed Jul. 13, 2009 to Final Office Action mailed May 13, 2009", 11 pgs.

"U.S. Appl. No. 11/466,056, Non-Final Office Action mailed Jul. 16, 2009", 30 pgs.

"European Application Serial No. 03809813.3, Office Action mailed Jan. 14, 2009", 8 pgs.

"European Application Serial No. 03737399.0, Summons to Attend Oral Proceedings Received mailed Aug. 7, 2009", 9 pgs.

"Korean Application Serial No. 10-2002-7005203, Office Action Mailed Jan. 13, 2009", 6 pages.

"U.S. Appl. No. 09/933,845, Examiner Interview Summary mailed Mar. 12, 2010", 3 pgs.

"U.S. Appl. No. 09/933,845, Examiner Interview Summary mailed Jul. 21, 2009", 4 pgs.

"U.S. Appl. No. 09/933,845, Final Office Action mailed May 13, 2010", 17 pgs.

"U.S. Appl. No. 09/933,845, Response to Final Office Action mailed May 13, 2010", 17.

"U.S. Appl. No. 10/073,772, Response filed Jan. 3, 2006 to Non Final Office Action mailed Sep. 19, 2005", 21 pgs.

"U.S. Appl. No. 10/533,211, Examiner Interview Summary mailed Sep. 24, 2007", 4 pgs.

"U.S. Appl. No. 11/800,904, Restriction Requirement mailed Mar. 17, 2010", 6 pgs.

"Japanese Application Serial No. 2002-565363, Office Action mailed Jul. 11, 2010", 4 Pgs.

"Japanese Application Serial No. 2002-521757, Office Action mailed on Dec. 27, 2010", 4 pgs.

"Japanese Application Serial No. 2002-565363, Office Action mailed Feb. 2, 2011", 2 pgs.

* cited by examiner

GENERATING AND MATCHING HASHES OF MULTIMEDIA CONTENT

CLAIM OF PRIORITY

This application is Continuation of U.S. application Ser. No. 10/073,772 filed Feb. 11, 2002, now U.S. Pat. No. 7,549,052 which claims the priority benefit of EP Application No. 01202720.7 filed on Jul. 17, 2001, which in turn claims the priority benefit of EP Application No. 01200505.4 filed on Feb. 12, 2001, all of which are incorporated herein by reference.

FIELD OF THE INVENTION

The invention relates to a method and arrangement for generating a hash signal identifying an information signal. The invention also relates to a method and arrangement for matching such a hash signal with hash signals stored in a database.

BACKGROUND OF THE INVENTION

Hash functions are generally known in the field of cryptography, where they are used, inter alia, to identify large amounts of data. For instance, in order to verify correct reception of a large file, it suffices to send the hash value (also referred to as signature) of that file. If the returned hash value matches the hash value of the original file, there is almost complete certainty that the file has been correctly received by the receiving party. The remaining uncertainty is introduced due to the fact that a collision might occur: i.e. two different files may have the same hash value. A carefully designed hash function minimizes the probability of collision.

A particular property of a cryptographic hash is its extreme fragility. Flipping a single bit in the source data will generally result in a completely different hash value. This makes cryptographic hashing unsuitable for identifying multimedia content where different quality versions of the same content should yield the same signature. Signatures of multimedia content that are to a certain extent invariant to data processing (as long as the processing retains an acceptable quality of the content) are referred to as robust signatures or, which is our preferred naming convention, robust hashes. By using a database of robust hashes and content identifiers, unknown content can be identified, even if it is degraded (e.g. by compression or AD/DA conversion). Robust hashes capture the perceptually essential parts of audio-visual content.

Using a robust hash to identify multimedia content is an alternative to using watermarking technology for the same purpose. There is, however, also a great difference. Whereas watermarking requires action on original content (viz. watermark embedding) before being released, with its potential impact on content quality and logistical problems, robust hashing requires no action before release. The drawback of hashing technology is that access to a database is needed (e.g. hashing is only viable in a connected context), whereas watermark detectors can operate locally (for example in non-connected DVD players).

U.S. Pat. No. 4,677,466 discloses a known method of deriving a signature from a television signal for broadcast monitoring. In this prior art method, the signature is derived from a short video or audio sequence after the occurrence of a specified event such as a blank frame.

OBJECT AND SUMMARY OF THE INVENTION

It is a general object of the invention to provide a robust hashing technology. More particularly, it is a first object of the invention to provide a method and arrangement for extracting a limited number of hashing bits from multimedia content. The hashing bits are robust, but not in a sense that the probability of bit errors is zero. It is known that non-exact pattern matching (i.e. searching for the most similar hash value in the database) is NP-complete. In layman's terms, this means that the best search strategy is an exhaustive search, which is prohibitive in many applications dealing with large databases. Therefore, a second object of the invention is to provide a method and arrangement that overcomes this NP-complete search complexity.

The first object is achieved by dividing the information signal into successive (preferably overlapping) frames, computing a hash word for each frame, and concatenating successive hash words to constitute a hash signal (or hash in short). The hash word is computed by thresholding a scalar property or a vector of properties of the information signal, for example, the energy of disjoint frequency bands or the mean luminance of image blocks.

The second object is achieved by selecting a single hash word of an input block of hash words, searching said hash word in the database, calculating a difference between the input block of hash words and a corresponding stored block of hash words. These steps are repeated for further selected hash words until said difference is lower than a predetermined threshold.

Further features of the invention are defined in the subclaims.

DESCRIPTION OF EMBODIMENTS

Before describing a preferred embodiment, a general description of considerations underlying this invention will be elucidated.

Two signals (audio, video, image) can differ quite drastically (e.g. by compression) in a signal theoretical sense, whereas they are perceptually indistinguishable. Ideally, a hash function mimics the behavior of the human auditory system (HAS) or human visual system (HVS), i.e. it produces the same hash signal for content that is considered the same by the HAS/HVS. However, many kinds of processing (compression, noise addition, echo addition, D/A and A/D conversion, equalization etc.) can be applied to the signal and there is no algorithm that is able to mimic the HAS/HVS perfectly. A complicating factor is that even the HAS/HVS varies from person to person as well as in time, and even the notion of one single HAS/HVS is untenable. Also, the classical definition of a hash does not take time into account: a robust hash should not only be able to identify the content, but should also be able to identify time (intervals). For this reason the following definition for a robust hash is herein used: A robust hash is a function that associates with every basic time-unit of multimedia content a semi-unique bit-sequence that is continuous with respect to content similarity as perceived by the HAS/HVS.

In other words, if the HAS/HVS identifies two pieces of audio, video or image as being very similar, the associated hashes should also be very similar. In particular, the hashes of original content and compressed content should be similar. Also, if hash words are computed for overlapping frames, the hash words should be similar, i.e. hashes should have a low pass character. On the other hand, if two signals really represent different content, the robust hash should be able to distinguish the two signals (semi-unique). This is similar to the collision requirement for classical cryptographic hashes. The required robustness of the hashing function is achieved by deriving the hash function from robust features (properties), i.e. features that are to a large degree invariant to processing. Robustness can be expressed by the Bit Error Rate (BER), which is defined as the ratio of the number of erroneous bits and the total number of bits.

Robust hashing enables content identification which is the basis for many interesting applications. Consider the example of identification of content in a multimedia database. Suppose one is viewing a scene from a movie and would like to know from which movie the shot originates. One way of finding out is by comparing the scene to all fragments of the same size of all movies in the database. Obviously, this is totally infeasible in case of a large database: even a short video scene is represented by a large amount of bytes and potentially these have to be compared to the whole database. Thus, for this to work, one needs to store a large amount of easily accessible data and all these data have to be compared with the video scene to be identified. Therefore, there is both a storage problem (the database) as well as a computational problem (matching large amounts of data). Robust hashing alleviates both problems by reducing the number of bits needed to represent the video scenes: fewer bits need to be stored and fewer bits need to be used in the comparison.

Robust hashing of audio signals will be described first. The audio signal will be assumed to be mono audio that has been sampled at a sample frequency of 44.1 kHz (CD-quality). If the audio is stereo, there are two options: either hash signals are extracted for the left and the right channel separately, or the left and the right channel are added prior to hash signal extraction.

Even if we only have a short piece of audio (of the order of seconds), we would like to determine which song it is. As audio can be seen as an endless stream of audio-samples, it is necessary to subdivide audio signals into time intervals or frames and to calculate a hash word for every frame.

Very often, when trying to match hashes in a database, it is impossible to determine the frame boundaries. This synchronization problem is particularly applicable to audio hashing. This problem is solved by dividing the signal into overlapping frames. Overlapping also ensures that hash words of contiguous frames have a certain amount of correlation. In other words, the hashes change slowly over time.

Figure 1:
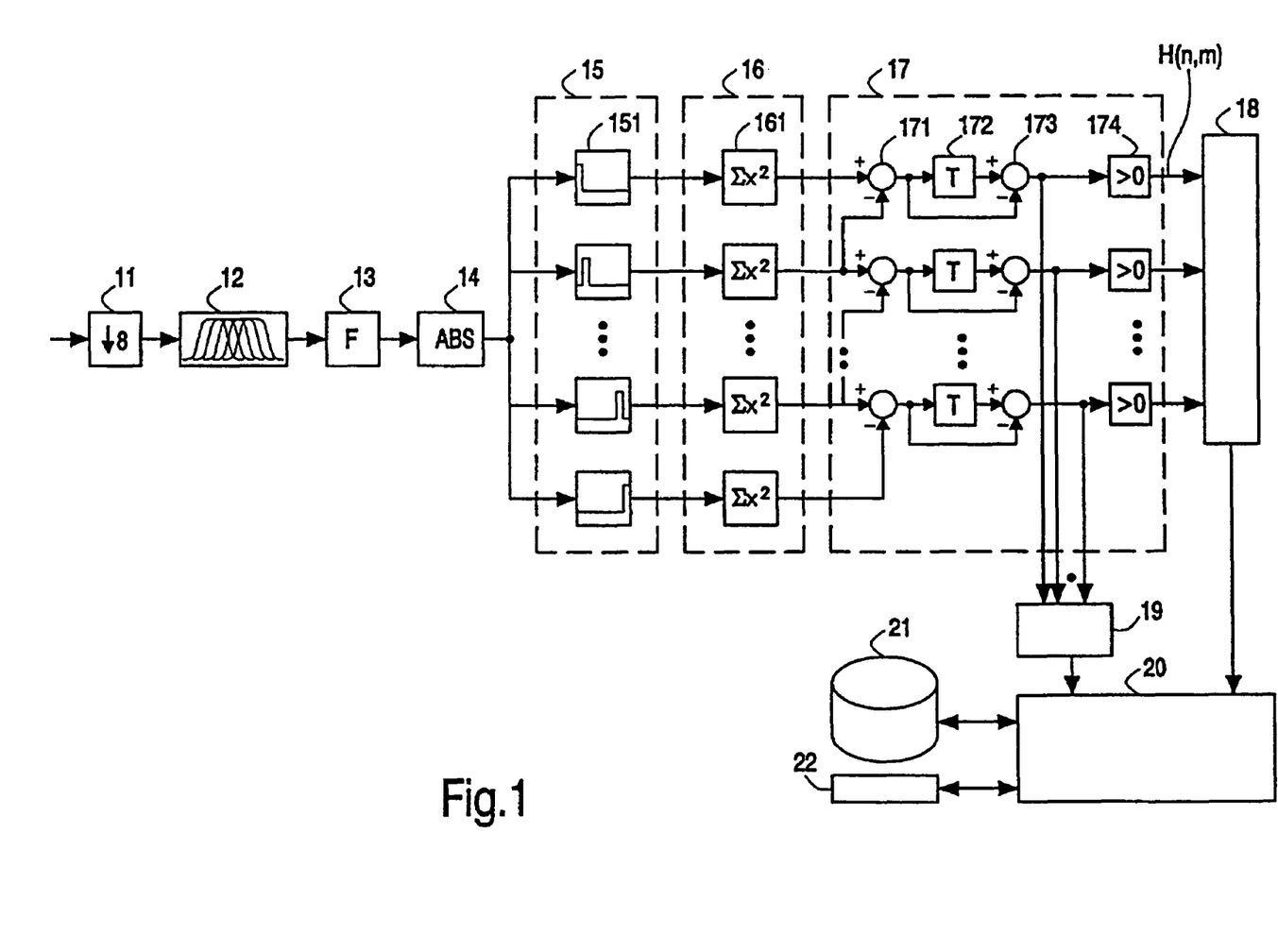
FIG. 1 is a schematic diagram of an embodiment of an arrangement for extracting a hash signal from an audio signal in accordance with the invention.

FIG. 1 shows a schematic diagram of an embodiment of an arrangement for generating an audio hash signal in accordance with the invention. The audio signal is first downsampled in a downsampler 11 to reduce the complexity of subsequent operations and restrict the operation to a frequency range of 300-3000 Hz, which is most relevant for the Human Auditory System.

In a framing circuit 12, the audio signal is divided into frames. The frames are weighed by a Hanning window having a length of 16384 samples (.apprx eq. 0.4 seconds) and an overlap factor of 31/32. The overlap is chosen in such a way that a high correlation of the hash words between subsequent frames is ensured. The spectral representation of every frame is computed by a Fourier transform circuit 13. In the next block 14, the absolute values (magnitudes) of the (complex) Fourier coefficients are computed.

Figure 2:
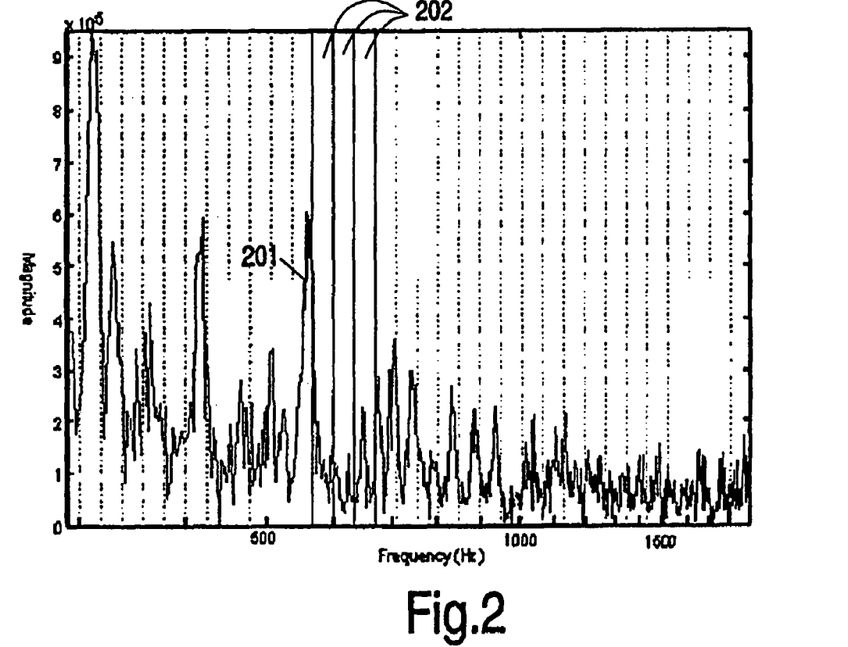
FIG. 2 is a diagram illustrating the subdivision of an audio signal spectrum into logarithmically spaced bands.

A band division stage 15 divides the frequency spectrum into a number (e.g. 33) of bands. In FIG. 1, this is schematically shown by selectors 151, each of which selects the Fourier coefficients of the respective band. In a preferred embodiment of the arrangement, the bands have a logarithmic spacing, because the HAS also operates on approximately logarithmic bands. By choosing the bands in this manner, the hash will be less susceptible to processing changes such as compression and filtering. In the preferred embodiment, the first band starts at 300 Hz and every band has a bandwidth of one musical tone (i.e. the bandwidth increases by a factor of $2^{1/12} \approx 1.06$ per band). FIG. 2 shows an example of a spectrum 201 of a frame and the subdivision thereof into logarithmically spaced bands 202.

Subsequently, for every band a certain (not necessarily scalar) characteristic property is calculated. Examples of properties are energy, tonality and standard deviation of the power spectral density. In general, the chosen property can be an arbitrary function of the Fourier coefficients. Experimentally it has been verified that the energy of every band is a property that is most robust to many kinds of processing. This energy computation is carried out in an energy computing stage 16. For each band, it comprises a stage 161 which computes the sum of the (squared) magnitudes of the Fourier coefficients within that band.

In order to get a binary hash word for each frame, the robust properties are subsequently converted into bits. The bits can be assigned by calculating an arbitrary function of the robust properties of possibly different frames and then comparing it to a threshold value. The threshold itself might also be a result of another function of the robust property values.

In the present arrangement, a bit derivation circuit 17 converts the energy levels of the bands into a binary hash word. In a simple embodiment, the bit derivation stage generates one bit for each band, for example, a '1' if the energy level is above a threshold and a '0' if the energy level is below said threshold. The thresholds may vary from band to band. Alternatively, a band is assigned a hash bit '1' if its energy level is larger than the energy level of its neighbor, otherwise the hash bit is '0'. The present embodiment uses an even improved version of the latter alternative. To prevent a major single frequency in the audio signal from producing identical hash words for successive frames, variations of the amplitude over time are also taken into account. More particularly, a band is assigned a hash bit '1' if its energy level is larger than the energy level of its neighbor and if that was also the case in the previous frame, otherwise the hash bit is '0'. If we denote the energy of a band m of frame n by EB(n,m) and the m-th bit of the hash word H of frame n by H(n,m), the bit derivation circuit 17 generates the bits of the hash word in the following manner:

$$H(n, m) = \begin{cases} 1 & \text{if } EB(n,m) - EB(n, m+1) - (EB(n-1, m) - EB(n-1, m+1)) > 0 \\ 0 & \text{if } EB(n,m) - EB(n, m+1) - (EB(n-1, m) - EB(n-1, m+1)) \leq 0 \end{cases}$$

To this end, the bit derivation circuit 17 comprises, for each band, a first subtractor 171, a frame delay 172, a second subtractor 173, and a comparator 174. The 33 energy levels of the spectrum of an audio frame are thus converted into a 32-bit hash word. The hash words of successive frames are finally stored in a buffer 18, which is accessible by a computer 20. The computer stores the robust hashes of a large number of original songs in a database 21.

Figure 3:
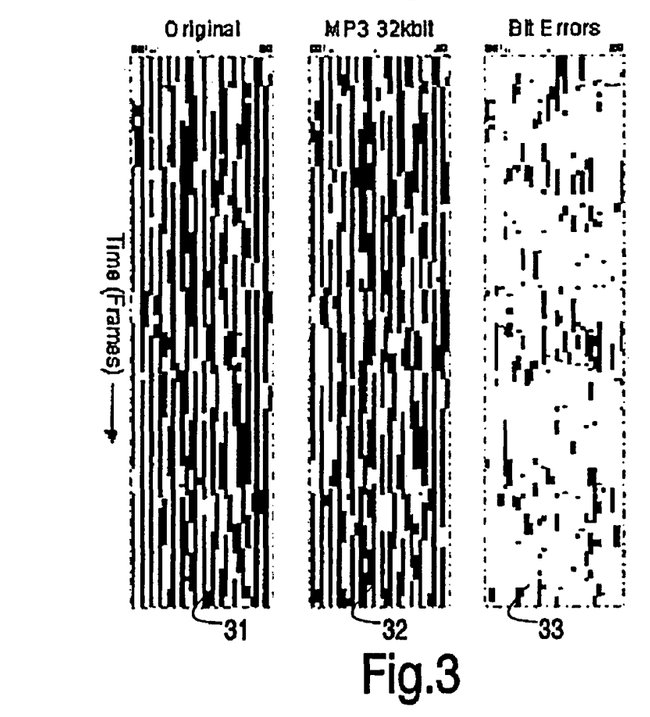
FIG. 3 is a diagram illustrating hash words extracted from an audio clip.

In a subsequent operation, the same arrangement computes the hash of an unknown audio clip. Reference numeral 31 in FIG. 3 shows the hash words of 256 successive overlapping audio frames (≈3 seconds) of the audio clip as stored in the database 21. In the Figure, each row is a 32-bit hash word, a white pixel represents a '1' bit of the hash word, a black pixel represents a '0' bit, and time proceeds from top to bottom. Reference numeral 32 shows the hash words extracted from the same audio clip after MP3 compression at 32 kBit/s. Ideally, the two hash blocks should be identical, but due to the compression some bits are different. The difference is denoted 33 in FIG. 3.

Robust hashing of image or video signals will now be described. Again, the robust hashes are derived from specific features of the information signal. The first question to be asked is in which domain to extract said features which determine the hash word. In contrast to audio, where the frequency domain optimally represents the perceptual characteristics, it is less clear which domain to use. For complexity reasons it is preferable to avoid complex operations, like DCT or DFT transformations. Therefore, features in the spatio-temporal domain are computed. Moreover, to allow easy feature extraction from most compressed video streams as well, features are chosen which can be easily computed from block-based DCT coefficients.

Based on these considerations, the preferred algorithm is based on simple statistics, like mean and variance, computed over relatively large image regions. The regions are chosen in a fairly simple way: the image frame is divided into square blocks of 64 by 64 pixels. The features are extracted from the luminance component. This is, however, not a fundamental choice: the chrominance components may be used, as well. As a matter of fact, the easiest way to increase the number of hash bits is to extract them from the chrominance components in a similar way as the extraction from the luminance.

Figure 4:
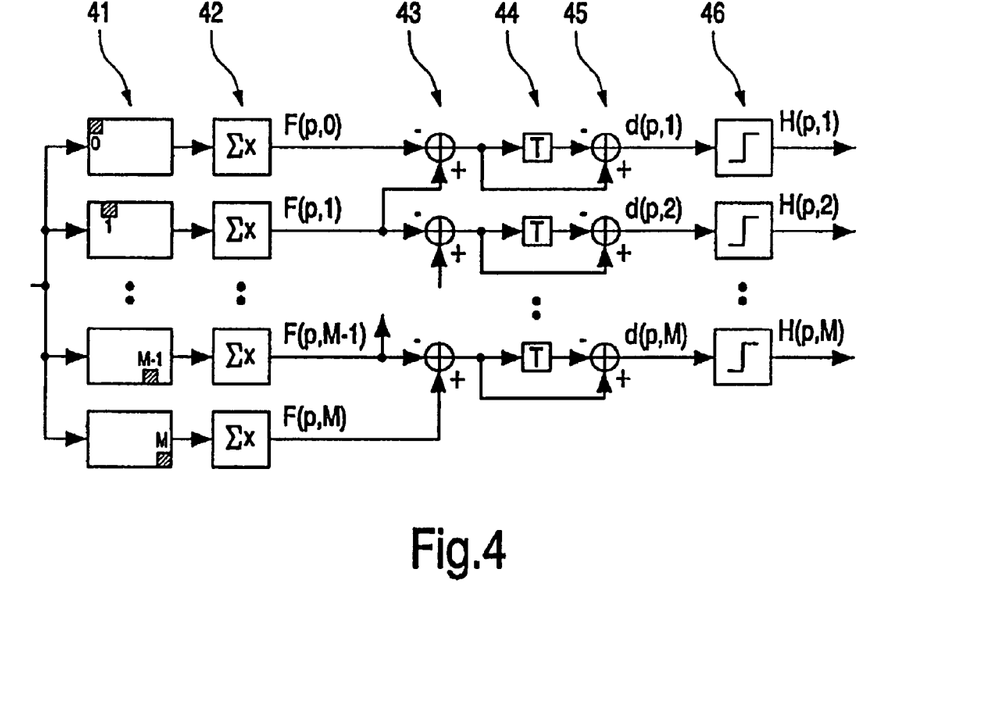
FIG. 4 is a schematic diagram of an embodiment of an arrangement for extracting a hash signal from a video signal in accordance with the invention.

FIG. 4 shows a block diagram of an arrangement for generating a hash signal identifying a video signal in accordance with the invention. The arrangement receives successive frames of the video signal. Each frame is divided (41) in M+1 blocks. For each of these blocks, the mean of the luminance values of the pixels is computed (42). The mean luminance of block k in frame p is denoted F(p,k) for k=0, . . . , M.

In order to make the hash independent of the global level and scale of the luminance, the luminance differences between two consecutive blocks are computed (43). Moreover, in order to reduce the correlation of the hash words in the temporal direction, the difference of spatial differential mean luminance values in consecutive frames is also computed (44, 45). In other words, a simple spatio-temporal 2×2 Haar filter is applied to the mean luminance. The sign of the result constitutes (46) the hash bit H(p,k) for block k in frame p. In mathematical notation:

$$H(p, k) = \begin{cases} 1 & \text{if } (F(p,k) - F(p, k-1)) - (F(p-1, k) - F(p-1, k-1)) \geq 0 \\ 0 & \text{if } (F(p,k) - F(p, k-1)) - (F(p-1, k) - F(p-1, k-1)) < 0 \end{cases}$$

Figure 5:
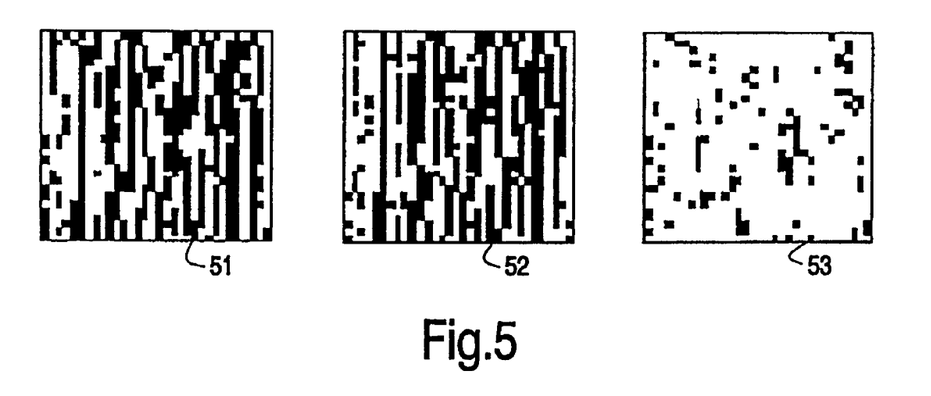
FIG. 5 is a diagram illustrating hash words extracted from a video sequence.

In this example, each frame is divided in 33 blocks (i.e., M=32) of size 64×64. A complete hash H consists of the bits extracted from 30 consecutive frames. Such a hash block, consisting of 30 hash words of 32 bits each (960 bits) leads to a sufficiently small false positive probability, as will be shown below. A typical original hash block is depicted 51 in FIG. 5, where black and white correspond to '0' and '1', respectively. The corresponding hash block of the same material scaled horizontally to 94% is denoted by reference numeral 52. Numeral 53 denotes the difference between the hash blocks 51 and 52. In this case the bit error rate equals 11.3%. Note how indeed the erroneous bits have a strong correlation in the temporal (vertical) direction.

The process of matching extracted hash blocks to the hash blocks in a large database will now be described. This is a non-trivial task since it is well-known that imperfect matching (remember that the extracted hash words may have bit errors) is NP-complete. This will be shown by means of the following (audio) example. In a database, 100,000 songs of approximately five minutes (≡25000 hash words per song) are stored. It will be assumed that a hash block having 256 hash words (e.g. hash block 32 in FIG. 3) has been extracted from the unknown audio clip. It is now to be determined to which of the 100,000 stored songs the extracted hash block matches best. Hence the position of a hash block in one of the 100,000 songs has to be found, which most resembles the extracted hash block, i.e. for which the bit error rate (BER) is minimal or, alternatively, for which the BER is lower than a certain threshold. The threshold directly determines the false positive rate, i.e. the rate at which songs are incorrectly identified from the database.

Two 3 seconds audio clips (or two 30-frame video sequences) are declared similar if the Hamming distance between the two derived hash blocks $H_1$ and $H_2$ is below a certain threshold T. This threshold T directly determines the false positive rate $P_f$, i.e. the rate at which two audio clips/video sequences are incorrectly declared equal (i.e. incorrectly in the eyes of a human beholder): the smaller T, the smaller the probability $P_f$ will be. On the other hand, a small value T will negatively effect the false negative probability $P_n$, i.e. the probability that two signals are 'equal', but not identified as such. In order to analyze the choice of this threshold T, we assume that the hash extraction process yields random i.i.d. (independent and identically distributed) bits. The number of bit errors will then have a binomial distribution with parameters (n,p), where n equals the number of bits extracted and p(=0.5) is the probability that a '0' or '1' bit is extracted. Since n(32×256=8192 for audio, 32×30=960 for video) is large in our application, the binomial distribution can be approximated by a normal distribution with a mean $\mu$=np and standard deviation $\sigma\sqrt{np(1-p)}$. Given a hash block $H_1$ the probability that a randomly selected hash block $H_2$ has less than $T=\alpha n$ errors with respect to $H_1$ is given by:

$$P_f(\alpha) = \frac{1}{2\pi} \int_{(1-2\alpha)\sqrt{a}}^{\infty} e^{\frac{x^2}{2}} dx = \frac{1}{2} \text{erfc}\left(\frac{1-2\alpha}{\sqrt{2}}\sqrt{n}\right) \quad (1)$$

However, in practice the robust hashes have high correlation along the time axis. This is due to the large time correlation of the underlying video sequence, or the overlap of audio frames. Experiments show that the number of erroneous bits are normally distributed, but that the standard deviation is approximately $\frac{3}{2}$ times larger than the i.i.d. case. Equation (1) therefore is modified to include this factor $\frac{3}{2}$.

$$P_f(\alpha) = \frac{1}{2} \text{erfc}\left(\frac{1-2\alpha}{3}\sqrt{2n}\right) \quad (2)$$

The threshold for the BER used during experiments was $\alpha=0.25$. This means that, of 8192 bits, less than 2048 bit errors have to occur in order to decide that the hash block originates from the same song. In this case the bit errors have a normal distribution with a mean $\mu$ of np=4096 and a standard deviation $\sigma$ of $3\sqrt{(np(1-p))}=135.76$. The chosen threshold setting then corresponds to the false alarm probability of $15.2\sigma$. Hence, the false alarm probability equals $1.8\cdot10^{-52}$. Note, however, that the false alarm probability will be higher in practice if music with similar hash words (e.g. a Mozart piece played by two different pianists) is included in the database.

Searching the position of the extracted hash block in the database can be done by brute force matching. This will take around 2.5 billion (=25000×100,000) matches. Moreover, the number of matches increases linearly with the size of the database.

Figure 6:
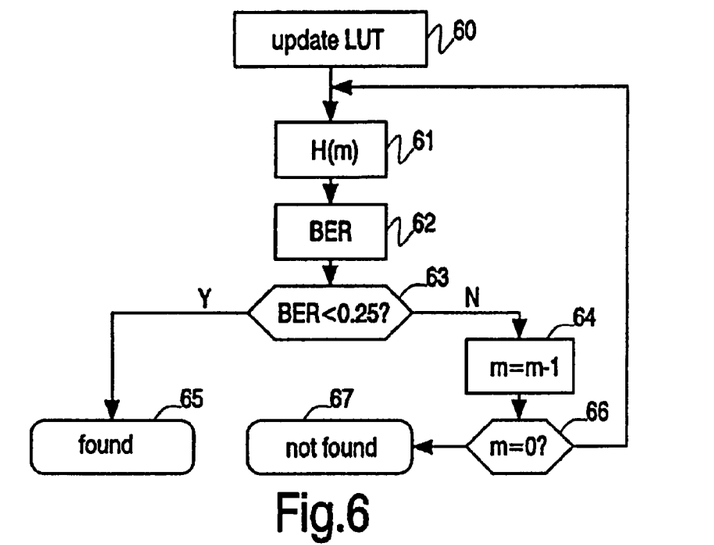
FIG. 6 is a flow chart of operations carried out by a computer which is shown in FIG. 1 in accordance with the invention.
Figure 7:
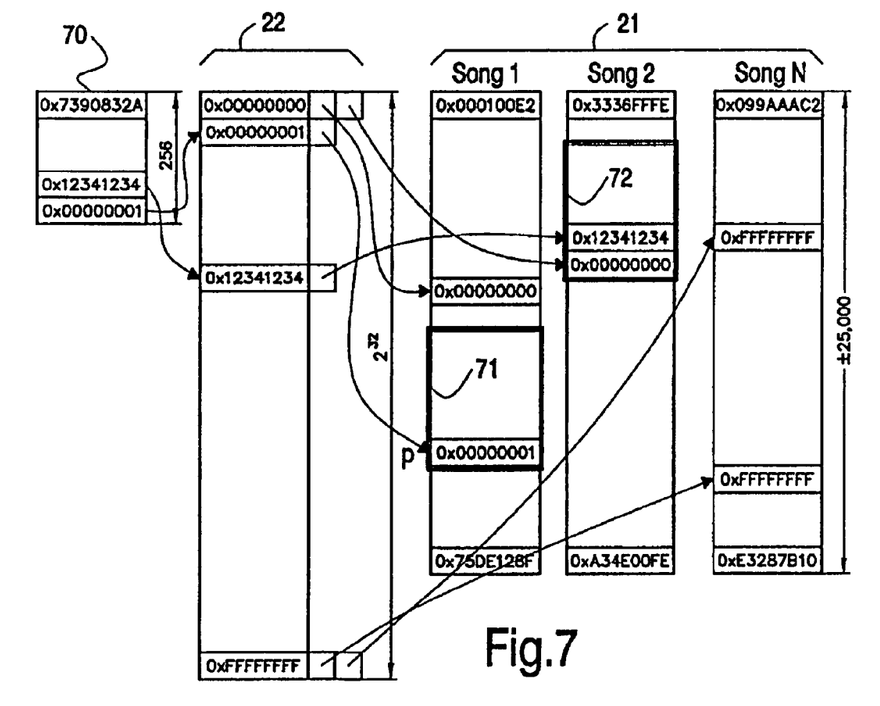
FIG. 7 is a diagram to illustrate the operation of a computer which is shown in FIG. 1.

In accordance with an aspect of the invention, the computer 20 uses a more efficient strategy for finding the corresponding song in the database 21. FIG. 6 is a flow chart of operations carried out by the computer. Upon storing an original song in the database, the computer updates a lookup table (LUT) in a step 60. The LUT is shown as a separate memory 22 in FIG. 1, but it will be appreciated that it will be part of the large database memory 21 in practice. As is shown in FIG. 7, the LUT 22 has an entry for each possible 32-bit hash word. Each entry of the LUT points to the song(s) and the position(s) in that song where the respective hash word occurs. Since a hash word can occur at multiple positions in multiple songs, the song pointers are stored in a linked list. Thus the LUT can generate multiple candidate songs. Note that a LUT containing $2^{32}$ entries can be impractical when there is only a limited number of songs in the database. In such a case, it is advantageous to implement the LUT with a hash table and a linked list. Reference numeral 70 in FIG. 7 denotes a block of 256 hash words extracted from the unknown audio clip (e.g. hash block 32 in FIG. 3).

In a first embodiment of the matching method, it will be assumed that every now and then a single hash word has no bit errors. In a step 61, a single hash word H(m) is selected from the hash block and sent to the database. Initially, this will be the last hash word H(256) of the extracted hash block. In the example shown in FIG. 7, this is the hash word 0x0000000. The LUT in the database points to a certain position in song 1. Let it be assumed that this position is position p. In a step 62, the computer calculates the BER between the extracted hash block and the block of hash words from position p-255 until position p of song 1 (denoted 71 in FIG. 7). In a step 63, it is checked whether the BER is low (<0.25) or high. If the BER is low, there will be a high probability that the extracted hash words originate from song 1. If the BER is high, either the song is not in the database or the single hash word H(m) contains an error. The latter will be assumed to be the case in this example. Another single hash word is then selected in a step 64 and looked up in the LUT. In FIG. 7, the last but one single hash word H(255) is now being looked up. This hash word appears to occur in song 2. The BER between input block 70 and stored block 72 appears to be lower than 0.25 now, so that song 2 is identified as the song from which the audio clip originates. Note that the last hash word in the stored block 52 is 0x00000000. Apparently, the previously selected hash word 0x000000 had one bit error.

The computer thus only looks at one single hash word at a time and assumes that every now and then such a single hash word has no bit errors. The BER of the extracted hash block is then compared with the corresponding (on the time axis) hash blocks of the candidate songs. The title of the candidate song with the lowest BER will be chosen as the song from which the extracted hash words originate, provided that the lowest BER is below the threshold (step 65). Otherwise, the database will report that the extracted hash block was not found. Another single hash word will then be tried. If none of the single hash words leads to success (step 66), the database will respond by reporting the absence of the candidate song in the database (step 67).

Figure 8:
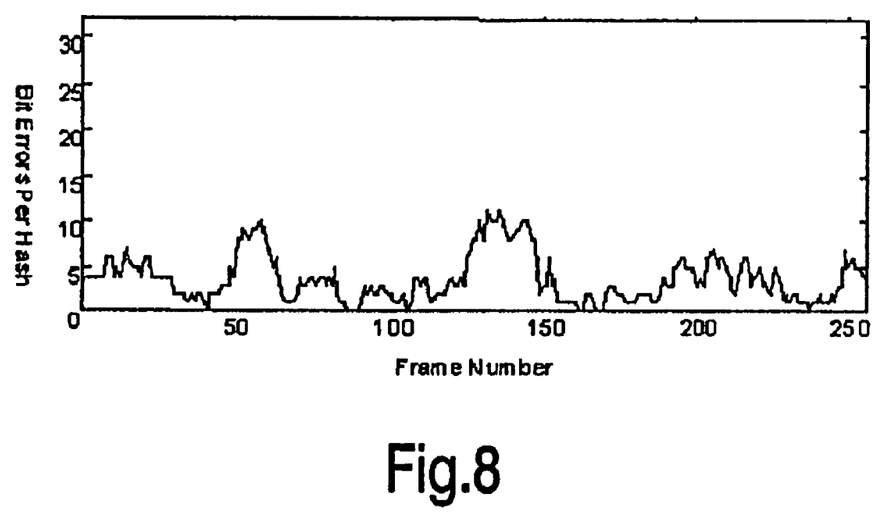
FIG. 8 shows a graph of the number or bit errors in hash words forming an extracted hash block which is shown in FIG. 3.

The above-described method relies on the assumption that every now and then an extracted hash word has no bit errors, i.e. it is perfectly equal to the corresponding stored hash word. Extensive experiments have shown that this occurs regularly a few times per second for most audio. This is shown, for example, in FIG. 8 which shows the number of bit errors in the 256 hash words forming the extracted block of FIG. 3B. Thirteen hash words occur without any bit errors in this 3-second audio clip.

However, it is unlikely that hash words without any bit errors occur when the audio is severely processed. In that case, the title of the song cannot be retrieved by means of the previous method. To this end, another embodiment of the matching method will be described. This method uses soft information of the hash extraction algorithm to find the extracted hash words in the database. Soft information is understood to mean the reliability of a bit, or the probability that a hash bit has been retrieved correctly. In this embodiment, the arrangement for extracting the hash words includes a bit reliability determining circuit. The bit reliability determining circuit is denoted 19 in the audio hash extraction arrangement which is shown in FIG. 1. It circuit receives the differential energy band levels in the form of real numbers. If the real number is very close to the threshold (which is zero in this example), the respective hash bit is unreliable. If instead the number is very far from the threshold, it is a reliable hash bit. The threshold can be fixed or controlled such that the number of reliable bits is fixed.

Figure 9:
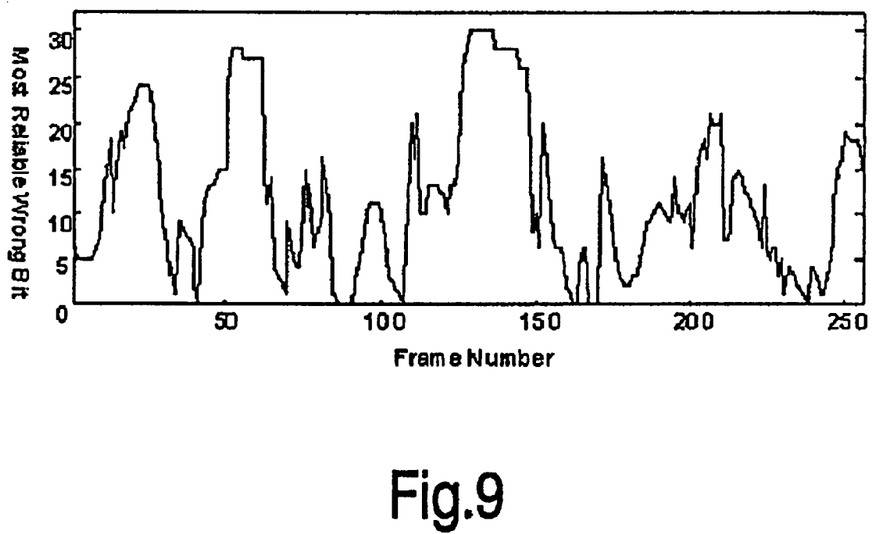
FIG. 9 shows a graph of the most reliable bit of the hash words of the hash block which is shown in FIG. 3.

The bit reliability determining circuit 19 determines the reliability of every hash bit, and thus enables the extraction arrangement or the computer 20 to generate a list of most probable alternative hash words for each hash word. By assuming again that at least one of the alternative hash words is correct, the song title can be received correctly and easily. FIG. 9 shows, for all the 256 hash words of hash block 32 in FIG. 3, which bit of the hash word is the most reliable.

Figure 10:
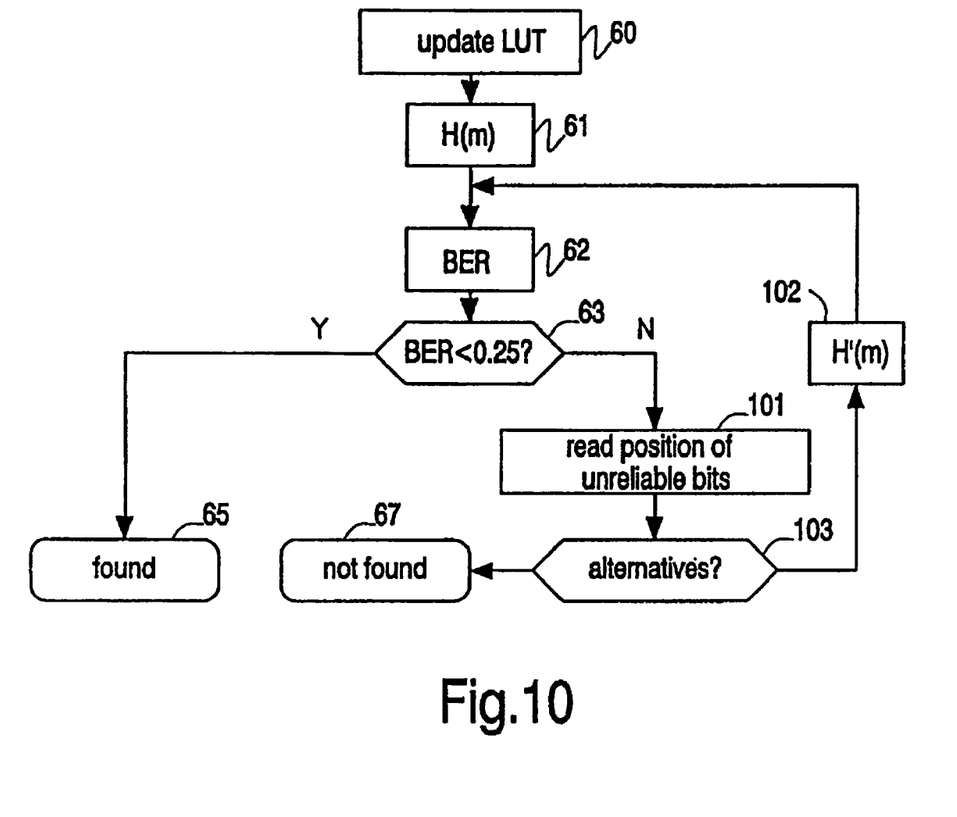
FIG. 10 is a flow chart of operations carried out by the computer which is shown in FIG. 1 in accordance with a further embodiment of the invention.

FIG. 10 is a flow chart of operations carried out by the computer in this embodiment of the method of finding the extracted hash block in the database. The same reference numerals are used for operations already described before. Again, the last extracted hash word (0x00000001, see FIG. 7) of the hash block is initially selected and sent to the database (step 61). The LUT in the database points to position p in song 1. The BER between the extracted hash block and the corresponding block 71 in song 1 is calculated (step 62). Meanwhile, it is known from the previous example that the BER is high. In a step 101, the computer now consults the bit reliability determining circuit 19 (FIG. 1) and learns that bit 0 is the least reliable bit of this particular hash word. The next most probable candidate hash word is now obtained by flipping said bit. The new hash word (0x00000000) is sent to the database in a step 102. As is shown in FIG. 7, the hash word 0x00000000 leads to two possible candidate songs in the database: song 1 and song 2. If, for example, the extracted hash words now have a low BER with the hash words of song 2, song 2 will be identified as the song from which the extracted hash block originates. Otherwise, new hash word candidates will be generated, or another hash word will be used to try to find the respective song in the database. This strategy is continued until it is found in a step 103 that there are no further alternative candidate hash words.

Note that, once a piece of audio is identified in practice as originating from a certain song, the database can first try to match the extracted hash words with that song before generating all the candidate hash words.

A very simple way of generating a list of most probable hash words is to include all the hash words with N most reliable bits being fixed and every possible combination for the remaining bits. In the case of 32 bits per hash and choosing N=23, a list of 512 candidate hash words is required. Furthermore it means that the 9 least reliable bits of the hash word can be wrong before an audio excerpt cannot be identified anymore. For the case shown in FIG. 6, this means that 117 hash words, instead of 13 with the previous method, will yield a correct pointer to the song in the database.

In an alternative embodiment of the matching method, the matching is done only on the basis of hash bits being marked as reliable. This method is based on the insight that it is unnecessary to compare unreliable bits of a received hash with the corresponding bits in the database. This leads to a far smaller bit error rate, although this comes at the cost of a more complicated search strategy and a larger bandwidth needed to transmit all necessary information to the database.

A few applications of robust hashing will now be described.

Broadcast Monitoring: A broadcast monitoring system consists of two parts: a central database containing the hashes of a large number of songs, and monitoring stations that extract a hash block from the audio that is broadcast by, for instance, radio stations. The monitoring station will send the extracted hash block to the central database and then the database will be able to determine which song has been broadcast.

Mobile Phone Audio Info: Imagine that you are in a bar and hear a song of which you want to know the title. You then just pick up your mobile telephone and call an audiohash database. The audiohash database will then hear the song and extract a hash block. If it then finds the hash block in the database, it will report back the title of the song.

Connected Content (MediaBridge): The company Digimarc currently has an application called MediaBridge, which is based on watermarking technology. The idea is that a watermark in a piece of multimedia will direct a user to a certain URL on the Internet where he can get some extra information. E.g. an advertisement in a magazine is watermarked. By holding this advertisement in front of a webcam, a watermark detector will extract a watermark key that is sent to a database. This database then contains the URL to which the user will be redirected. The same application can work with the use of robust hashing technology. In the future, one might even think of a person pointing his mobile videophone at a real-life object. The audio hash database will then report back information about this object, either directly or via an URL on the Internet.

Multimedia Quality Metering: If the hash words of high quality original content are listed in the database, a quality measure can be obtained by determining the BER of the extracted hash words of processed multimedia content.

From an abstract point of view, the robust audio hashes are derived from an audio signal by comparing energy in different frequency bands and over time. A generalization of this approach is to consider any cascade of LTI and non-linear functions. In particular, a robust hash can also be obtained by applying a (dyadic) filter bank (an LTI operator), followed by squaring or taking absolute words (a non-linear function), followed by a difference operator over time and/or band (an LTI operator), finally followed by a thresholding operator. By applying a carefully designed linear filter bank as an initial operator, the complexity of a FFT can be avoided. Moreover, as many compression engines have a linear filter bank as an initial phase, there is the option to integrate feature extraction with compression.

It is further noted that robust hashing and digital watermarks can be used in combination to identify content. The method described above and some watermark detection algorithms have a number of initial processing steps in common, viz. the computation of the spectral representation. This leads to the idea that watermark detection and feature extraction can easily be integrated in one application. Both retrieved watermark and hash words can then be sent to a central database for further analysis, to allow identification of content.

In summary, the disclosed method generates robust hashes for multimedia content, for example, audio clips. The audio clip is divided (12) into successive (preferably overlapping) frames. For each frame, the frequency spectrum is divided (15) into bands. A robust property of each band (e.g. energy) is computed (16) and represented (17) by a respective hash bit. An audio clip is thus represented by a concatenation of binary hash words, one for each frame. To identify a possibly compressed audio signal, a block of hash words derived therefrom is matched by a computer (20) with a large database (21). Such matching strategies are also disclosed. In an advantageous embodiment, the extraction process also provides information (19) as to which of the hash bits are the least reliable. Flipping these bits considerably improves the speed and performance of the matching process.

What is claimed is:

1. A method to identify multimedia content, the method comprising:
   receiving an input block of hash words, the input block representing at least a part of an information signal;
   interrogating a look-up table with a selected hash word from the input block to obtain a found hash word;
   comparing, by a computer, the input block and a stored block of hash words in which the found hash word has the same position as the selected hash word;
   selectively identifying the stored block of hash words as a matching reference signal based on the outcome of the comparing;
   wherein the selected hash word comprises a plurality of reliable hash bits and unreliable hash bits; and
   the interrogating comprises interrogating the look-up table with reliable bits of the selected hash word.

2. The method of claim 1, further comprising selecting a further hash word in response to determining that the difference between the input block and the stored block is greater than a predetermined threshold.

3. The method of claim 2, wherein the selecting of the further hash word comprises reversing an unreliable bit from the selected hash word.

4. The method of claim 3, wherein the selecting of the further hash word comprises:
receiving information indicative of reliability of a bit of the selected hash word; and
using said the information to determine the unreliable bit.

5. The method of claim 1, wherein the selectively identifying of the stored block of hash words as a matching reference signal comprises:
calculating a bit error rate between bits of the input block and corresponding bits of the stored block; and
identifying the stored block of hash words as the matching reference signal based on the calculated bit error rate.

6. The method of claim 1, further comprising returning an identification associated with the stored block.

7. A method to identify subject content, the method comprising:
receiving a hash value associated with an information signal, the hash value comprising one or more reliable hash bits and one or more unreliable hash bits;
interrogating a look up table with the one or more reliable bits to determine one or more matching stored hash values;
for each of the one or more matching stored hash values, calculating, by a computer, a bit error rate, the bit error rate representing a relationship between the one or more bits of the hash value and the corresponding bits of a matching stored hash value from the one or more matching stored hash values;
selecting a matching stored hash value from the one or more matching stored hash values, for which the bit error rate is minimal; and
identifying the matching stored hash value, for which the bit error rate is minimal, as the matching stored hash value associated with the subject content.

8. The method of claim 7, wherein the subject content is audio content.

9. The method of claim 7, wherein the subject content is video content.

* * * * *

UNITED STATES PATENT AND TRADEMARK OFFICE
CERTIFICATE OF CORRECTION

PATENT NO. : 7,921,296 B2
APPLICATION NO. : 11/800904
DATED : April 5, 2011
INVENTOR(S) : Jaap A. Haitsma et al.

Page 1 of 1

It is certified that error appears in the above-identified patent and that said Letters Patent is hereby corrected as shown below:

Title Pg, Item (56)
On page 3, under "Other Publications", in column 2, line 32, delete "Projeccts" and insert -- Projects --, therefor.

Title Pg, Item (56)
On page 3, under "Other Publications", in column 2, line 44, delete "Phas-Only" and insert -- Phase-Only --, therefor.

Title Pg, Item (56)
On page 4, under "Other Publications", in column 2, line 33, delete "the the" and insert -- the --, therefor.

In column 4, line 12, delete "(.apprx eq." and insert -- (.apprxeq. --, therefor.

In column 5, line 8, delete "EB(n,m" and insert -- EB(n,m) --, therefor.

In column 7, line 64, delete "0x0000000." and insert -- 0x00000001. --, therefor.

In column 9, line 57, delete "audiohash" and insert -- audio hash --, therefor.

In column 9, line 58, delete "audiohash" and insert -- audio hash --, therefor.

Signed and Sealed this
Seventh Day of June, 2011

David J. Kappos
*Director of the United States Patent and Trademark Office*